(12) United States Patent  
Taya

(10) Patent No.: US 9,673,118 B2  
(45) Date of Patent: Jun. 6, 2017

(54) POWER MODULE AND METHOD OF MANUFACTURING POWER MODULE

(71) Applicant: MITSUBISHI ELECTRIC CORPORATION, Chiyoda-ku (JP)

(72) Inventor: Masaki Taya, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 15/038,590

(22) PCT Filed: Jul. 31, 2014

(86) PCT No.: PCT/JP2014/004028  
§ 371 (c)(1),  
(2) Date: May 23, 2016

(87) PCT Pub. No.: WO2015/079600  
PCT Pub. Date: Jun. 4, 2015

(65) Prior Publication Data  
US 2016/0300770 A1  Oct. 13, 2016

(30) Foreign Application Priority Data

Nov. 26, 2013 (JP) ................ 2013-243924

(51) Int. Cl.  
*H01L 23/02* (2006.01)  
*H01L 23/053* (2006.01)  
(Continued)

(52) U.S. Cl.  
CPC ........ *H01L 23/053* (2013.01); *H01L 21/4853* (2013.01); *H01L 23/293* (2013.01);  
(Continued)

(58) Field of Classification Search  
None  
See application file for complete search history.

(56) References Cited

U.S. PATENT DOCUMENTS

2006/0012016 A1* 1/2006 Betz .............. H01L 23/047  
257/678  
2010/0252922 A1* 10/2010 Bayerer .......... H01L 23/04  
257/692

(Continued)

FOREIGN PATENT DOCUMENTS

JP  08-008395 A  1/1996  
JP  2005-183495 A  7/2005  
(Continued)

OTHER PUBLICATIONS

International Search Report issued on Nov. 11, 2014 for PCT/JP2014/004028 filed on Jul. 31, 2014.

*Primary Examiner* — Michael Lebentritt  
(74) *Attorney, Agent, or Firm* — Oblon, McClelland, Maier & Neustadt, L.L.P.

(57) ABSTRACT

A power module providing an improved manufacture yield and having an ensured stable joint strength and accordingly improved reliability is provided. The power module includes: a base portion having one surface on which an electrode portion is formed; a conductor portion disposed to face the one surface of the base portion on which the electrode portion is formed, for making electrical connection with the outside; and an interconnect portion connected to the electrode portion formed on the one surface of the base portion and to the surface of the conductor portion facing the one surface of the base portion for electrically connecting the electrode portion to the conductor portion.

11 Claims, 8 Drawing Sheets

(51) Int. Cl.
*H01L 25/07* (2006.01)
*H01L 25/18* (2006.01)
*H01L 23/373* (2006.01)
*H01L 23/498* (2006.01)
*H01L 21/48* (2006.01)
*H01L 23/29* (2006.01)
*H01L 23/31* (2006.01)
*H01L 23/535* (2006.01)
H01L 23/24 (2006.01)
H01L 23/00 (2006.01)

(52) U.S. Cl.
CPC ...... *H01L 23/3142* (2013.01); *H01L 23/3735* (2013.01); *H01L 23/49811* (2013.01); *H01L 23/49844* (2013.01); *H01L 23/535* (2013.01); *H01L 24/37* (2013.01); *H01L 24/40* (2013.01); *H01L 24/48* (2013.01); *H01L 24/84* (2013.01); *H01L 25/07* (2013.01); *H01L 25/18* (2013.01); H01L 23/24 (2013.01); H01L 24/05 (2013.01); H01L 24/29 (2013.01); H01L 24/32 (2013.01); H01L 24/35 (2013.01); H01L 24/45 (2013.01); H01L 24/83 (2013.01); H01L 2224/04026 (2013.01); H01L 2224/05624 (2013.01); H01L 2224/05647 (2013.01); H01L 2224/291 (2013.01); H01L 2224/32227 (2013.01); H01L 2224/35847 (2013.01); H01L 2224/37005 (2013.01); H01L 2224/37011 (2013.01); H01L 2224/37012 (2013.01); H01L 2224/37032 (2013.01); H01L 2224/37124 (2013.01); H01L 2224/37147 (2013.01); H01L 2224/4007 (2013.01); H01L 2224/4046 (2013.01); H01L 2224/40137 (2013.01); H01L 2224/40245 (2013.01); H01L 2224/45014 (2013.01); H01L 2224/45015 (2013.01); H01L 2224/45124 (2013.01); H01L 2224/48245 (2013.01); H01L 2224/73263 (2013.01); H01L 2224/83447 (2013.01); H01L 2224/83815 (2013.01); H01L 2224/84205 (2013.01); H01L 2224/84447 (2013.01); H01L 2224/85447 (2013.01); H01L 2924/00014 (2013.01); H01L 2924/00015 (2013.01); H01L 2924/13055 (2013.01); H01L 2924/13091 (2013.01); H01L 2924/181 (2013.01); H01L 2924/35121 (2013.01)

(56) References Cited

U.S. PATENT DOCUMENTS

2011/0042812 A1* 2/2011 Kayukawa .............. H01L 21/56 257/741
2014/0327127 A1* 11/2014 Hable .................... H01L 21/50 257/712
2015/0289356 A1* 10/2015 Izuo ........................ H01L 23/13 361/709
2016/0157351 A1* 6/2016 Taya ........................ H05K 5/02 361/752

FOREIGN PATENT DOCUMENTS

| | | |
|---|---|---|
| JP | 2005-259880 A | 9/2005 |
| JP | 2009-081198 A | 4/2009 |
| JP | 2009-231685 A | 10/2009 |
| JP | 2011-044452 A | 3/2011 |
| JP | 2012-209444 A | 10/2012 |
| JP | 2012-227320 A | 11/2012 |

* cited by examiner (a)

(b)

(c)

POWER MODULE AND METHOD OF MANUFACTURING POWER MODULE

TECHNICAL FIELD

The present invention relates to a power module, and particularly relates to an interconnect structure and a package structure of a power module.

BACKGROUND ART

A power module which includes a power semiconductor device (for example, IGBT (Insulated Gate Bipolar Transistor), MOSFET (Metal Oxide Semiconductor Field Effect Transistor), bipolar transistor, diode, or the like) mounted on a circuit board and which is packaged with a sealant resin is used for example in a motor drive apparatus or the like.

A package structure called case structure is mainly used for the power module. This case-type structure is a structure in which a power semiconductor device is mounted on a heat-dissipation metal base plate with an insulating substrate interposed therebetween and a case is bonded to the heat-dissipation metal base plate.

The power semiconductor device mounted in the module is connected to a main electrode. For connecting the power semiconductor device to the main electrode, a wire is used. As the wire, a wire made of aluminum alloy and having a diameter of 0.1 to 0.5 mm is generally used.

In the case where wires are ultrasonically welded, it is necessary to set the distance between wires adjacent to each other so as not to cause a head of an ultrasonic welding tool to interfere with a wire having already been mounted. In order to obtain a power module for higher current, it is necessary to increase the number of wires joined to the power semiconductor device. However, due to limitation of the size of the power semiconductor device, the number of wires which can be mounted is limited, and there has been a problem that a power module for higher current is difficult to obtain.

With the aim of solving this problem, direct lead bonding has been proposed and put to practical use, as a technique replacing the wire bonding. The direct lead bonding joins a plate-shaped main terminal (lead) to the power semiconductor device with solder. The direct lead bonding has a feature that it can be adapted to higher current and can reduce the interconnect resistance and the interconnect inductance, as compared with the wire bonding (PTD 1 for example).

However, in the case of the direct lead bonding, stress caused by a difference in linear expansion coefficient between the power semiconductor device and the plate-shaped main terminal is exerted on the solder portion which is a joint material, to thereby cause cracks in the solder, resulting in a problem that the reliability is deteriorated. In contrast to this, a method has been disclosed according to which many metal bumps are formed on a surface of a plate-shaped main terminal and this conductor plate is joined to a surface electrode of a power semiconductor device via the metal bumps by ultrasonic welding (PTD 2 for example). In the case of this technique, the many metal bumps serve as a buffer layer to alleviate the stress exerted on the joint.

CITATION LIST

Patent Document

PTD 1: Japanese Patent Laying-Open No. 8-8395 (page 5, FIG. 1)

PTD 2: Japanese Patent Laying-Open No. 2005-183495 (page 4, FIGS. 1 and 4)

SUMMARY OF INVENTION

Technical Problem

However, since many metal bumps are formed in the conventional power module, it is difficult to make respective heights of the metal bumps uniform. If the heights of the metal bumps are not uniform, some metal bumps do not contribute to the joint or a part of the metal bumps has a weak joint strength. Accordingly, the joint strength of the whole joint decreases, resulting in a problem that the reliability of the power module is deteriorated.

The present invention has been made to solve the above-described problems, and provides a power module whose reliability can be improved by an ensured stable joint strength.

Solution to Problem

A power module according to the present invention includes: a base portion having one surface on which an electrode portion is formed; a conductor portion disposed to face the base portion; and an interconnect portion joined to the electrode portion and a surface of the conductor portion, the surface of the conductor portion facing the one surface of the electrode portion.

Advantageous Effects of Invention

The present invention provides a structure in which the interconnect portion is joined to the surface of the conductor portion and to the surface of the base portion facing the surface of the conductor portion, and the interconnect portion flexes to absorb strain generated due to a difference in linear expansion coefficient between the conductor portion and the base portion. Therefore, the stress generated at the joint can be alleviated. Thus, the power module with improved reliability of the joint between the conductor portion and the base portion is obtained.

DESCRIPTION OF EMBODIMENTS

First Embodiment

Figure 1:
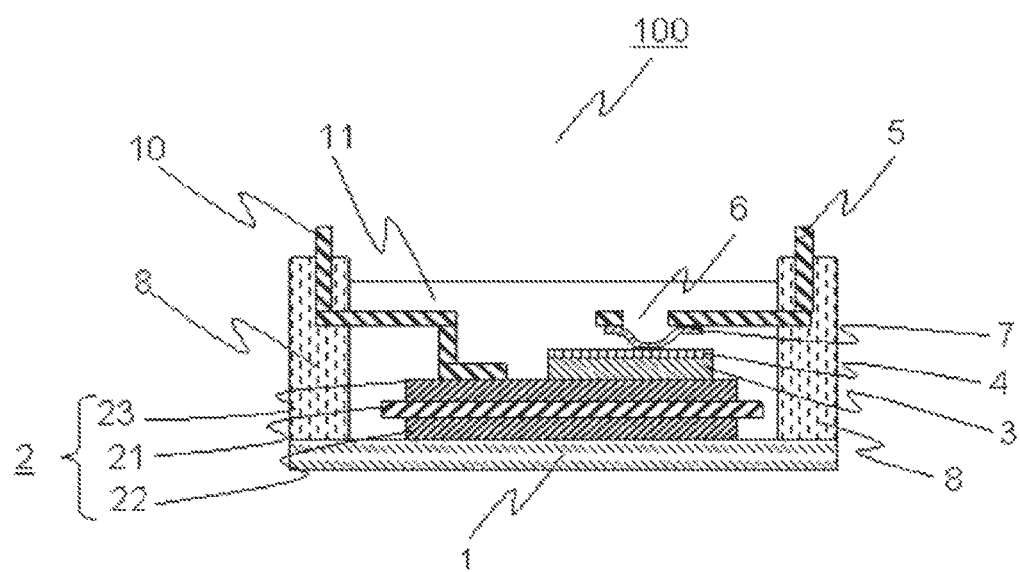
FIG. 1 is a schematic cross-sectional structure diagram of a power module in a first embodiment of the present invention.

FIG. 1 is a schematic cross-sectional structure diagram of a power module in a first embodiment of the present invention. Power module 100 in FIG. 1 includes a heat-dissipation metal base plate 1, an insulating substrate 2 which is a first base portion, a power semiconductor device 3 which is a second base portion, a surface electrode 4, main terminals 5, 10 which are each a conductor portion, an opening 6, a bonding ribbon 7 which is an interconnect portion, a case 8, and a sealant resin 11.

Insulating substrate 2 is joined onto heat-dissipation metal base plate 1 with solder or the like (not shown). Insulating substrate 2 includes an insulating layer 21 and metal plates 22, 23. Insulating substrate 2 has a structure in which metal plates 22, 23 of copper or the like are bonded to respective opposite sides of insulating layer 21 formed of a ceramic material such as aluminum oxide, aluminum nitride, or silicon nitride, or formed of epoxy resin or the like. On the front-side metal plate 23, an interconnect pattern (not shown) is formed. To this front-side metal plate 23, power semiconductor device 3 is joined with solder or the like (not shown).

A power-control semiconductor device such as MOSFET (Metal Oxide Semiconductor Field Effect Transistor) or IGBT (Insulated Gate Bipolar Transistor), or a power semiconductor device such as freewheel diode is used as power semiconductor device 3. On power semiconductor device 3, surface electrode 4 of aluminum, copper, or the like is formed. Surface electrode 4 is electrically connected to main terminal 5 via bonding ribbon 7 made of aluminum alloy or copper alloy. While bonding ribbon 7 is used in the first embodiment, it may be a bonding wire. In the case where the bonding wire is used, the bonding wire preferably has a large diameter.

Main terminal 5 is a plate electrode made of copper, and has opening 6 formed at a position facing power semiconductor device 3. Bonding ribbon 7 is formed in the shape of a loop across opening 6 formed in main terminal 5, and the opposite ends of bonding ribbon 7 are connected to main terminal 5 by ultrasonic welding which is a kind of ultrasonic joining. The loop portion of bonding ribbon 7 is ultrasonically welded to surface electrode 4 of power semiconductor device 3. Main terminal 5 is insert-molded or outsert-molded in case 8, and used for input/output of current and voltage. Another main terminal 10 which is similarly insert-molded or outsert-molded in case 8 is joined to front-side metal plate 22 of insulating substrate 2 with solder or the like. Case 8 is bonded to heat-dissipation metal base plate 1 with an adhesive. For the sake of ensuring electrical insulation of the inside of the module, sealant resin 11 such as silicone gel or epoxy resin fills the region surrounded by case 8 and heat-dissipation metal base plate 1.

Figure 2:
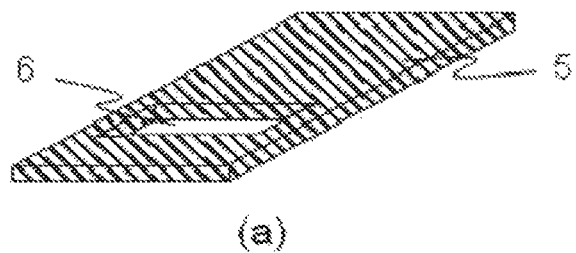
FIG. 2 is a schematic perspective structure diagram showing a method of manufacturing an electrode portion of the power module in the first embodiment of the present invention.
Figure 2:
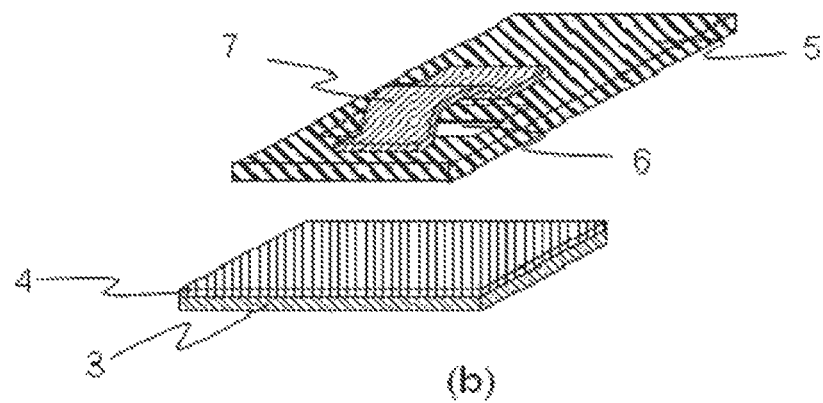
Figure 2:
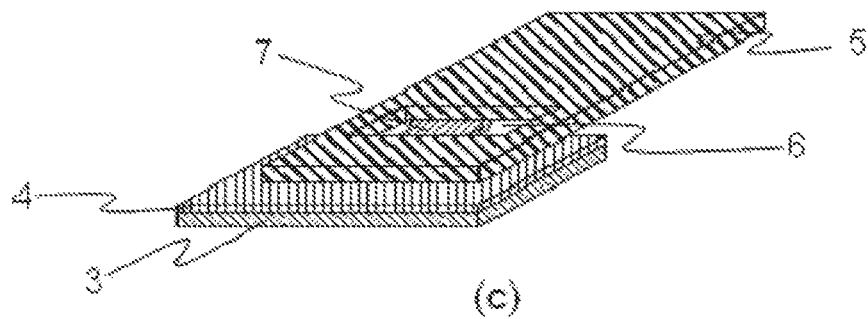
Figure 3:
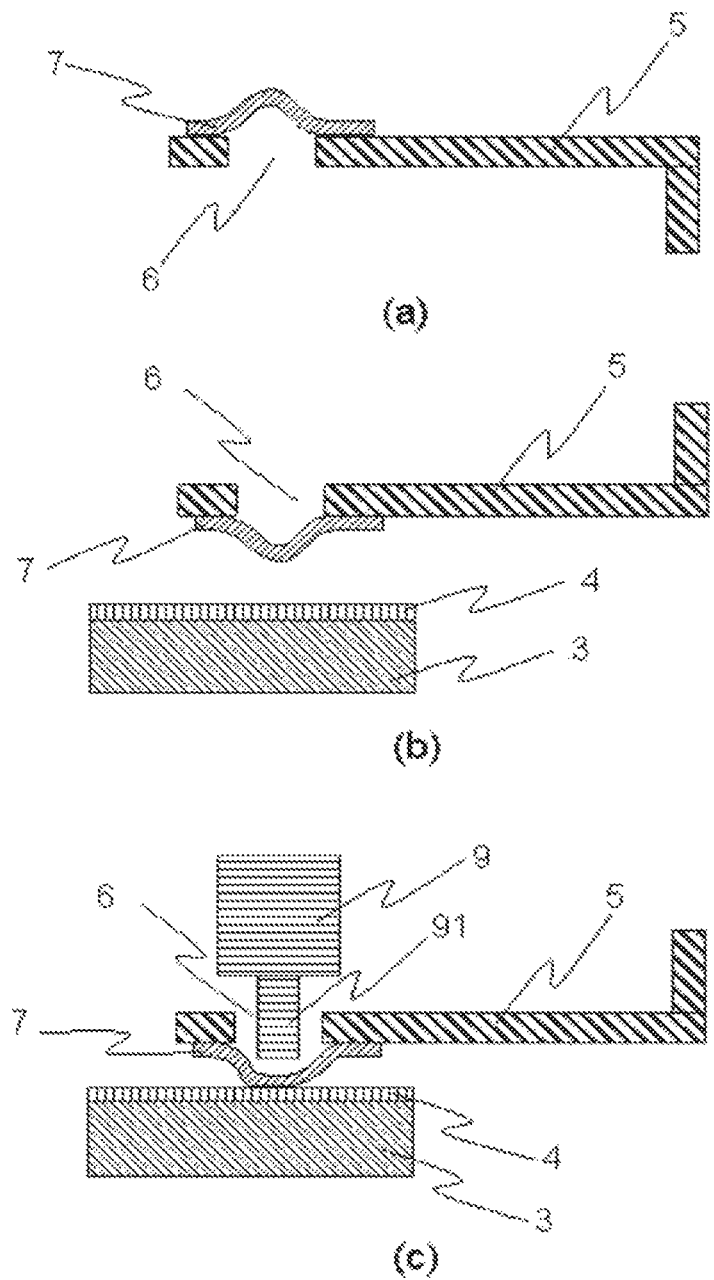
FIG. 3 is a schematic cross-sectional structure diagram showing the method of manufacturing the electrode portion of the power module in the first embodiment of the present invention.

FIG. 2 is a schematic perspective structure diagram showing a method of manufacturing an electrode portion of the power module in the first embodiment of the present invention. FIG. 3 is a schematic cross-sectional structure diagram showing the method of manufacturing the electrode portion of the power module in the first embodiment of the present invention. FIGS. 2 and 3 illustrate the step of joining surface electrode 4 of power semiconductor device 3 with main terminal 5 particularly by means of bonding ribbon 7.

The power module according to the first embodiment of the present invention can be manufactured through the steps described below. Heat-dissipation metal base plate 1, solder, insulating substrate 2, solder, and power semiconductor device 3 are stacked in this order and subjected to reflow soldering. Thus, heat-dissipation metal base plate 1, insulating substrate 2, and power semiconductor device 3 are solder-joined. Next, case 8 is bonded to heat-dissipation metal base plate 1 with an adhesive. Main terminal 5 to which bonding ribbon 7 is ultrasonically welded in the step described below is insert-molded in case 8 in advance.

As shown in FIG. 2 (a), opening 6 is formed in main terminal 5. Then, as shown in FIG. 2 (b) and FIG. 3 (a), in the step of joining the interconnect portion to the conductor portion by ultrasonic joining, ribbon bonding is performed to ultrasonically weld the opposite ends of bonding ribbon 7 to main terminal 5, across opening 6 of main terminal 5. For formation of a ribbon bond, a commercially available ribbon bonder may be used.

Next, as shown in FIG. 2 (c) and FIG. 3 (b), in the step of turning the conductor portion to cause a surface of the conductor portion, to which the interconnect portion is joined, to face downward, main terminal 5 to which bonding ribbon 7 is ultrasonically welded across opening 6 formed in main terminal 5 is turned so that the surface of main terminal 5 to which bonding ribbon 7 is ultrasonically welded faces surface electrode 4 of power semiconductor device 3. In this state, case 8 is bonded to heat-dissipation metal base plate 1 and main terminal 10 is solder-joined to insulating substrate 2.

Next, as shown in FIG. 3 (c), the conductor portion has the opening and, in the step of joining the interconnect portion to the electrode portion formed on the base portion by ultrasonic joining using a bonding jig passed through the opening, a head 91 of an ultrasonic welding tool 9 which is a bonding jig is inserted in opening 6 to ultrasonically weld the loop portion of bonding ribbon 7 to surface electrode 4 of power semiconductor device 3.

Next, in the step of resin sealing, insulating sealant resin 11 such as silicone gel or epoxy resin is injected and hardened to seal the inside of the region surrounded by case 8 and heat-dissipation metal base plate 1. In this way, insulating substrate 2, power semiconductor device 3, surface electrode 4, main terminals 5, 10, opening 6, and bonding ribbon 7 are sealed with the resin.

Through the above-described steps, the power module in the first embodiment can be manufactured. Through these steps, bonding ribbon 7 can be ultrasonically welded directly to surface electrode 4 of power semiconductor device 3. Therefore, a stable joint strength can be ensured.

Here, the size of opening 6 formed in main terminal 5 may be determined depending on the size and the current-carrying capacity of power semiconductor device 3 as well as the size of ultrasonic welding tool 9. It is necessary to determine the size of opening 6 so that the size of opening 6 is larger than the size of head 91 of ultrasonic welding tool 9 and opening 6 does not interfere with head 91 during ultrasonic welding. Since the minimum area required for ultrasonic welding is determined by the current rating of power semiconductor device 3, the size of head 91 may be set equal to or larger than this required minimum area.

It is also necessary to determine the thickness and the width of bonding ribbon 7 so that the temperature of power semiconductor device 3 is not caused to exceed an allowable value by heat generated by bonding ribbon 7 when the maximum rated current flows in power semiconductor device 3. Opening 6 may be formed by pressing or cutting. While the shape of opening 6 shown in the drawings is a rectangular shape, the shape is not necessarily limited to a rectangular shape, but may be any shape which does not interfere with head 91 of ultrasonic welding tool 9. Further, while ultrasonic welding is used here as a method of forming the joint, the method is not limited to ultrasonic welding, and any method of forming the joint can appropriately be selected depending on the material to be used for example.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Second Embodiment

A second embodiment differs from the first embodiment in that, while main terminal 5 used in the first embodiment has opening 6, main terminal 5 of the second embodiment does not have opening 6, and in that one end of bonding ribbon 7 is ultrasonically welded to the surface of main terminal 5 facing power semiconductor device 3 and the other end of bonding ribbon 7 is ultrasonically welded to surface electrode 4 of power semiconductor device 3 in the second embodiment. Thus, the distance across which bonding ribbon 7 joins main terminal 5 to surface electrode 4 is short, and therefore, the amount of bonding ribbon 7 used for joining can be reduced.

Figure 4:
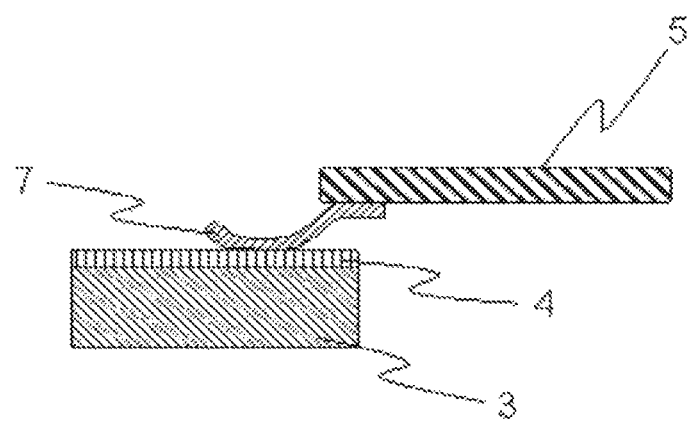
FIG. 4 is a schematic cross-sectional structure diagram of an electrode portion of a power module in a second embodiment of the present invention.

FIG. 4 is a schematic cross-sectional structure diagram of an electrode portion of a power module in the second embodiment of the present invention. In FIG. 4, a joint portion between power semiconductor device 3 and main terminal 5 includes power semiconductor device 3, surface electrode 4, main terminal 5, and bonding ribbon 7. Main terminal 5 does not have opening 6, and is disposed to face the side of power semiconductor device 3 on which surface electrode 4 is formed. One end of bonding ribbon 7 is ultrasonically welded to the surface of main terminal 5 facing power semiconductor device 3. The other end of bonding ribbon 7 is also ultrasonically welded to surface electrode 4 of power semiconductor device 3.

Figure 5:
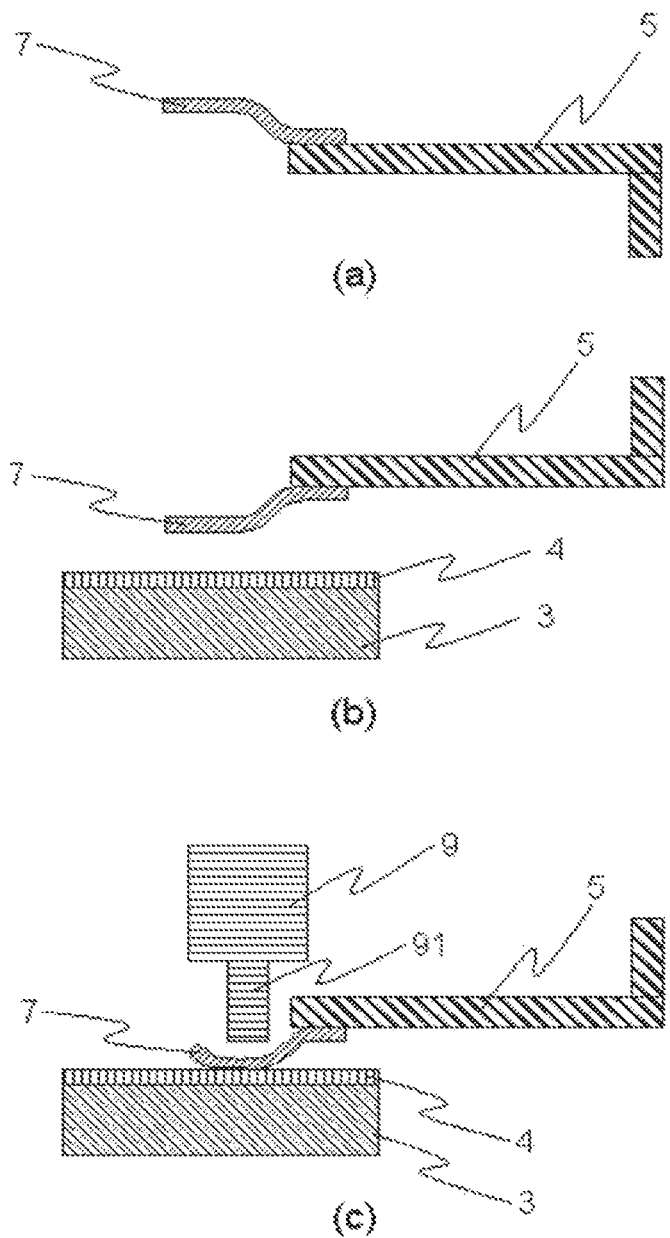
FIG. 5 is a schematic cross-sectional structure diagram showing a method of manufacturing the electrode portion of the power module in the second embodiment of the present invention.

FIG. 5 is a schematic cross-sectional structure diagram showing a method of manufacturing the electrode portion of the power module in the second embodiment of the present invention. As shown in FIG. 5 (a), in the step of joining the interconnect portion, one end of bonding ribbon 7 is ultrasonically welded to the surface of main terminal 5 which is to face power semiconductor device 3. At this time, the other end (another end) of bonding ribbon 7 is disposed so as not to overlap main terminal 5 as seen from the back side of main terminal 5, namely the back side with respect to the surface thereof which is to face power semiconductor device 3. Then, as shown in FIG. 5 (b), main terminal 5 to which the one end of bonding ribbon 7 is ultrasonically welded is disposed so that its surface to which bonding ribbon 7 is ultrasonically welded faces surface electrode 4 of power semiconductor device 3. Then, as shown in FIG. 5 (c), in the step of joining the interconnect portion by ultrasonic joining to the electrode portion formed on the base portion, ultrasonic welding tool 9 is used to ultrasonically weld the other end of bonding ribbon 7 which is not joined to main terminal 5, to surface electrode 4 of power semiconductor device 3. In this way, main terminal 5 is joined by bonding ribbon 7 to surface electrode 4 of power semiconductor device 3 in the second embodiment. Moreover, while ultrasonic welding is used here as a method of forming the joint, the method is not limited to ultrasonic welding, and any method of forming the joint can appropriately be selected depending on the material to be used for example.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, since it is unnecessary to form opening 6 in main terminal 5, the material utilization efficiency in manufacturing main terminal 5 is improved. Moreover, since the number of joints can be reduced, the manufacture yield can be improved and the lead time can be shortened. Moreover, the degree of freedom in arranging main terminal 5 and power semiconductor device 3 is increased. Therefore, particularly in the case where surface electrode 4 of power semiconductor device 3 has a small size, design is facilitated.

Further, since the length of bonding ribbon 7 used for joining main terminal 5 to power semiconductor device 3 can be minimized, the electrical resistance of bonding ribbon 7 is reduced and thus the amount of heat generated by bonding ribbon 7 when the power module is energized can be reduced. Accordingly, an effect of improving the reliability of the joint is obtained. Further, since the length of bonding ribbon 7 can be minimized, the thermal conductance between power semiconductor device 3 and main terminal 5 is reduced. Thus, the heat generated in power semiconductor device 3 when the power module is energized can be efficiently dissipated through bonding ribbon 7 to main terminal 5. Accordingly, temperature increase of power semiconductor device 3 can be suppressed and thus the reliability of the joint can be improved. Moreover, as compared with the first embodiment, the limitation of the size of head 91 of ultrasonic welding tool 9 is alleviated.

Third Embodiment

A third embodiment differs from the first embodiment in that, while solder joining is used for the joint portion between main terminal 10 and insulating substrate 2 in the first embodiment, opening 6 is formed in main terminal 10 like main terminal 5 and main terminal 10 is joined to insulating substrate 2 via bonding ribbon 7 in the third embodiment. Thus, the joint for main terminal 5 and the joint for main terminal 10 can be formed in the same step and the number of steps can be reduced. Moreover, the reliability of the joint between main terminal 10 and insulating substrate 2 can be improved.

Figure 6:
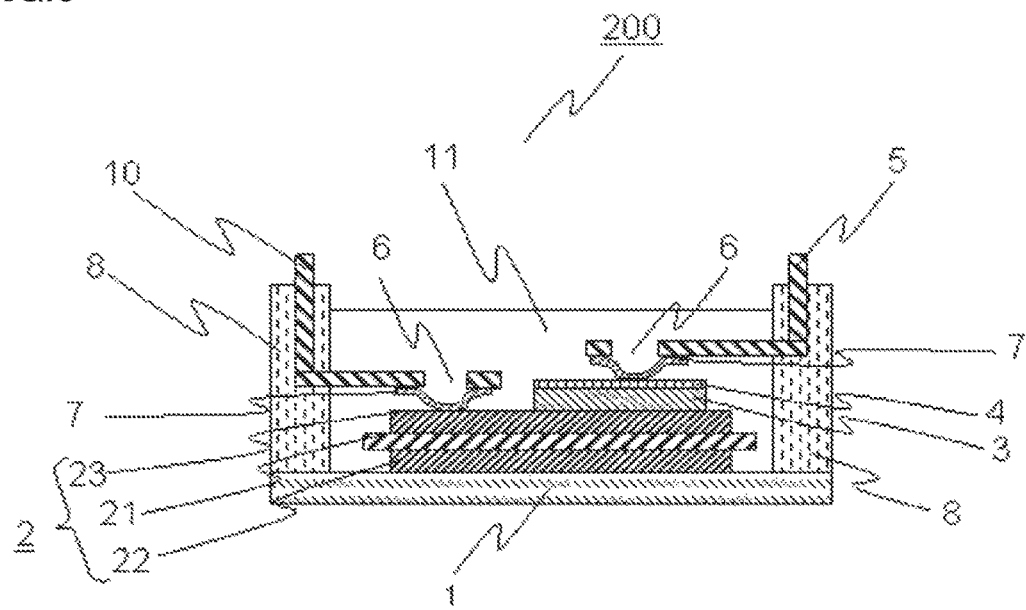
FIG. 6 is a schematic cross-sectional structure diagram of a power module in a third embodiment of the present invention.

FIG. 6 is a schematic cross-sectional structure diagram of a power module in the third embodiment of the present invention. Power module 200 in FIG. 6 includes heat-dissipation metal base plate 1, insulating substrate 2, power semiconductor device 3, surface electrode 4, main terminals 5, 10, opening 6, bonding ribbon 7, case 8, and sealant resin 11. While main terminal 10 is joined to insulating substrate 2 with solder in the first embodiment in FIG. 1, opening 6 is formed in main terminal 10 like main terminal 5 and main terminal 10 is joined to insulating substrate 2 via bonding ribbon 7 in the third embodiment.

Insulating substrate 2 is joined onto heat-dissipation metal base plate 1 with solder or the like (not shown). Insulating substrate 2 includes insulating layer 21 and metal plates 22, 23. Insulating substrate 2 has a structure in which metal plates 22, 23 of copper or the like are bonded to respective opposite sides of insulating layer 21 formed of a ceramic material such as aluminum oxide, aluminum nitride, or silicon nitride, or formed of epoxy resin or the like. On the front-side metal plate 23, an interconnect pattern (not shown) is formed. To this front-side metal plate 23, power semiconductor device 3 is joined with solder or the like (not shown).

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Further, since opening 6 is also formed in main terminal 10 and the surface of main terminal 10 is joined to the surface of insulating substrate 2 facing the aforementioned surface of main terminal 10 by means of bonding ribbon 7, the joint for main terminal 5 and the joint for main terminal 10 can be formed in the same step and the number of steps can be reduced. Moreover, the reliability of the joint between main terminal 10 and insulating substrate 2 can be improved.

Fourth Embodiment

A fourth embodiment differs from the first embodiment in that, while one opening 6 of main terminal 5 is used in the first embodiment, a plurality of openings are formed in main terminal 5 and a plurality of joints are formed via bonding ribbons 7 in the fourth embodiment. The number of joints can thus be increased to increase the current density of power semiconductor device 3. Moreover, under the condition that the current density of power semiconductor device 3 is the same, the density of current flowing in each bonding ribbon 7 can be reduced. Therefore, the reliability of the joint can further be improved.

Figure 7:
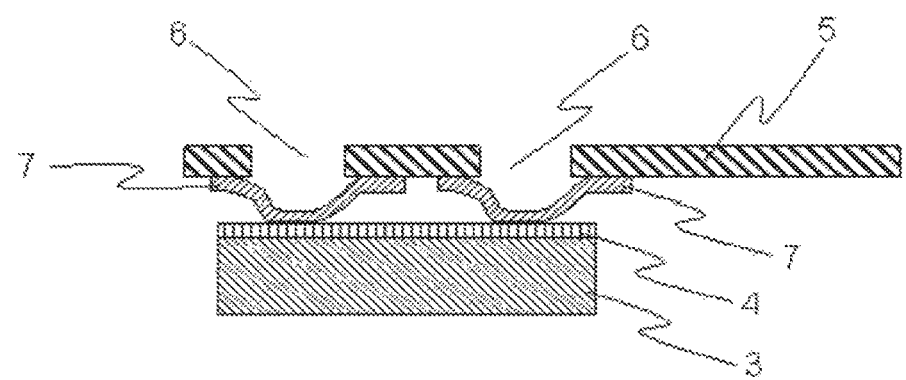
FIG. 7 is a schematic cross-sectional structure diagram of an electrode portion of a power module in a fourth embodiment of the present invention.

FIG. 7 is a schematic cross-sectional structure diagram of an electrode portion of a power module in the fourth embodiment of the present invention. In FIG. 7, the joint portion between power semiconductor device 3 and main terminal 5 includes power semiconductor device 3, surface electrode 4, main terminal 5, openings 6, and bonding ribbon 7. While FIG. 7 shows two joints with surface electrode 4 of power semiconductor device 3, the number of joints may be two or more. Moreover, while a plurality of joints are arranged in the longitudinal direction of main terminal 5, the arrangement of the joints is not limited to this arrangement and the joints may be arranged at any locations and in any direction within the range where surface electrode 4 of power semiconductor device 3 is present.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since a plurality of openings 6 are formed in main terminal 5 and the number of joints with surface electrode 4 of power semiconductor device 3 is increased, the current density of power semiconductor device 3 can be increased. Moreover, under the condition that the current density of power semiconductor device 3 is the same, the density of current flowing in each bonding ribbon 7 can be reduced. Therefore, the reliability of the joint can further be improved.

Fifth Embodiment

A fifth embodiment differs from the fourth embodiment in the following respect. In the fifth embodiment, a plurality of openings 6 are formed in main terminal 5 like the fourth embodiment and main terminal 5 is joined at a plurality of locations via bonding ribbon 7 by stitch connection. Since main terminal 5 is joined by this stitch connection, the number of locations where ultrasonic welding is done is reduced and thus the lead time of the step can be shortened.

Figure 8:
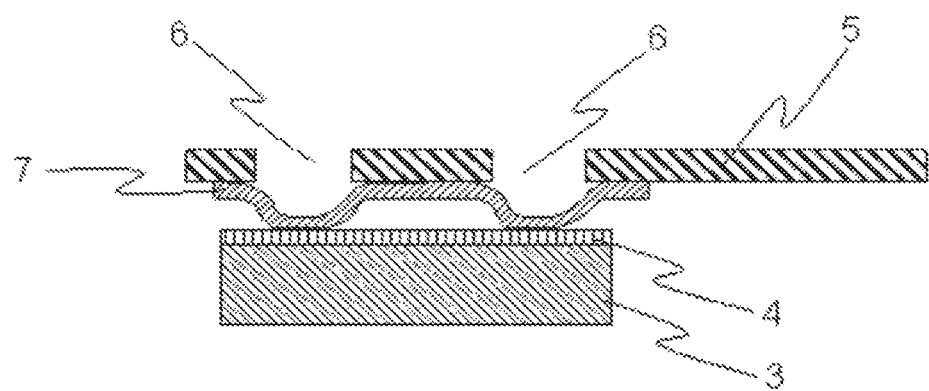
FIG. 8 is a schematic cross-sectional structure diagram of an electrode portion of a power module in a fifth embodiment of the present invention.

FIG. 8 is a schematic cross-sectional structure diagram of an electrode portion of a power module in the fifth embodiment of the present invention. In FIG. 8, the joint portion between power semiconductor device 3 and main terminal 5 includes power semiconductor device 3, surface electrode 4, main terminal 5, openings 6, and bonding ribbon 7.

While FIG. 8 shows two joints with surface electrode 4 of power semiconductor device 3, the number of joints with surface electrode 4 of power semiconductor device 3 may be two or more. Moreover, joints are formed at a plurality of locations via bonding ribbon 7 by the stitch connection, the number of locations of joints with main surface 5 made by ultrasonic welding can be reduced, as compared with the case where bonding ribbon 7 is joined across each opening 6 to main terminal 5.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since the joint between main terminal 5 and bonding ribbon 7 is made by the stitch connection, the number of locations where ultrasonic welding is done is reduced and therefore the lead time of the step can be shortened.

Sixth Embodiment

A sixth embodiment differs from the fourth embodiment in the following respect. In the sixth embodiment, in the surface of main terminal 5 used in the fourth embodiment which faces power semiconductor device 3, one or more openings 12 are also formed at a location(s) where bonding ribbon 7 is not formed. In this way, the ease of injection of sealant resin 11 into the region between main terminal 5 and power semiconductor device 3 can be increased and thus the manufacture yield can be improved.

Figure 9:
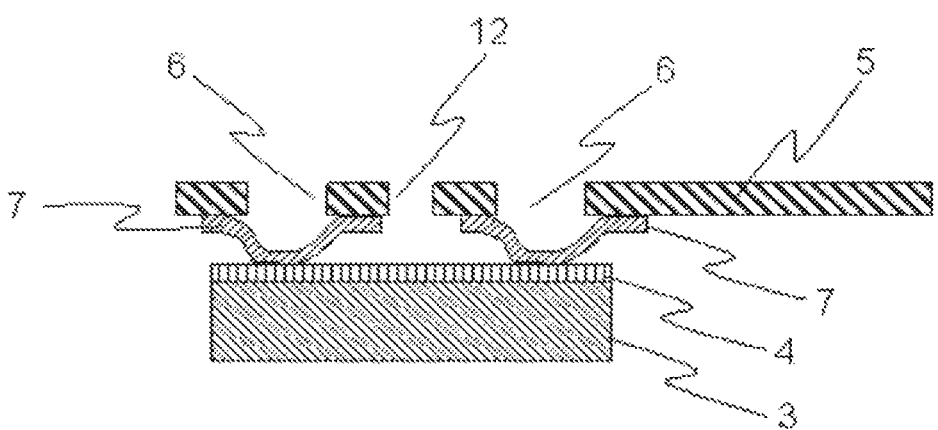
FIG. 9 is a schematic cross-sectional structure diagram of an electrode portion of a power module in a sixth embodiment of the present invention.

FIG. 9 is a schematic cross-sectional structure diagram of an electrode portion of a power module in the sixth embodiment of the present invention. In FIG. 9, the joint portion between power semiconductor device 3 and main terminal 5 includes power semiconductor device 3, surface electrode 4, main terminal 5, opening 6, bonding ribbon 7, and opening 12. In the surface of main terminal 5 facing power semiconductor device 3, one or more openings 12 are also formed at a location(s) where bonding ribbon 7 is not formed. With such a configuration, the ease of injection of sealant resin 11 into the region between main terminal 5 and power semiconductor device 3 can be increased and thus the manufacture yield can be improved.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since one or more openings 12 across which bonding ribbon 7 is not formed are provided in main terminal 5, the ease of injection of sealant resin 11 into the region between main terminal 5 and power semiconductor device 3 can be increased and thus the manufacture yield can be improved.

Seventh Embodiment

A seventh embodiment differs in the following respect. Like the fourth and fifth embodiments in which main terminal 5 is joined to power semiconductor device 3 at a plurality of locations, main terminal 10 of the third embodiment is also joined to insulating substrate 2 at a plurality of locations. In this way, the reliability can also be improved of the joint between main terminal 10 and insulating substrate 2.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since a plurality of openings 6 are provided also in main terminal 10 and thus the number of locations where main terminal 10 is joined to insulating substrate 2 is increased. Therefore, the reliability can also be improved of the joint between main terminal 10 and insulating substrate 2.

Eighth Embodiment

An eighth embodiment differs in the following respect. In the sixth embodiment, for the joint between main terminal 5 and power semiconductor device 3, one or more openings 12 are formed also at a location(s) where bonding ribbon 7 is not formed. This is applied to the joint between main terminal 10 and insulating substrate 2 in the eighth embodiment. Namely, one or more openings 12 are formed also at location(s) where bonding ribbon 7 is not formed. Since opening(s) 12 is thus provided in main terminal 10, the ease of injection of sealant resin 11 can be improved also for the joint between main terminal 10 and insulating substrate 2.

In the power module configured in the above-described manner, the surface of main terminal 5 is joined by the bonding ribbon 7 to the surface of power semiconductor device 3 facing the aforementioned surface of main terminal 5. Therefore, bonding ribbon 7 can flex to absorb strain generated due to a difference in linear expansion coefficient between main terminal 5 and power semiconductor device 3. Consequently, stress generated at the joint between main terminal 5 and power semiconductor device 3 is alleviated. Thus, peeling of main terminal 5 and power semiconductor device 3 from each other is suppressed, and the reliability of the joint between main terminal 5 and power semiconductor device 3 can be improved.

Moreover, main terminal 5 can be joined to power semiconductor device 3 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since one or more openings 12 across which bonding ribbon 7 is not formed are provided in main terminal 10, the ease of injection of sealant resin 11 into the region between main terminal 10 and insulating substrate 2 can be increased and thus the manufacture yield can be improved.

Ninth Embodiment

A ninth embodiment differs from the first embodiment in that while main terminal 5 is joined to one power semiconductor device 3 in the first embodiment, main terminal 5 is joined to a plurality of power semiconductor devices 3 in the ninth embodiment.

Figure 10:
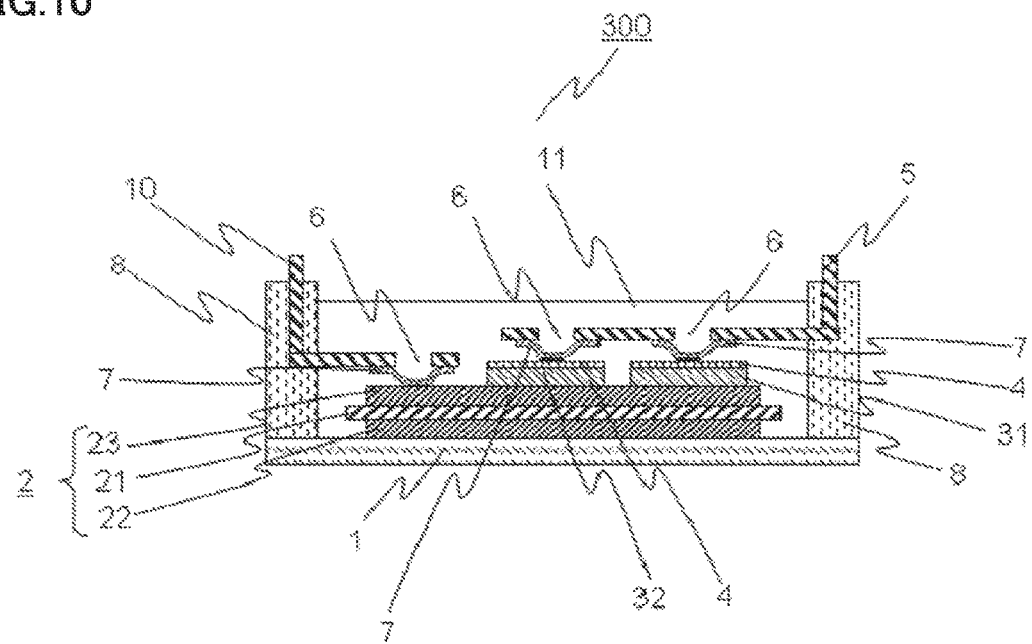
FIG. 10 is a schematic cross-sectional structure diagram of a power module in a ninth embodiment of the present invention.

FIG. 10 is a schematic cross-sectional structure diagram of a power module in the ninth embodiment of the present invention. Power module 300 in FIG. 10 includes heat-dissipation metal base plate 1, insulating substrate 2, power semiconductor devices 31, 32, surface electrode 4, main terminals 5, 10, opening 6, bonding ribbon 7, case 8, and sealant resin 11. In a configuration shown in FIG. 10, main terminal 5 is joined to two power semiconductor devices 31 and 32.

Insulating substrate 2 is joined onto heat-dissipation metal base plate 1 with solder or the like (not shown). Insulating substrate 2 includes insulating layer 21 and metal plates 22, 23. Insulating substrate 2 has a structure in which metal plates 22, 23 of copper or the like are bonded to respective opposite sides of insulating layer 21 formed of a ceramic material such as aluminum oxide, aluminum nitride, or silicon nitride, or formed of epoxy resin or the like. On the front-side metal plate 23, an interconnect pattern (not shown) is formed. To this front-side metal plate 23, power semiconductor devices 31, 32 are joined with solder or the like (not shown).

A power module used for driving a motor or the like performs switching of current and voltage as its basic operation. In the case where the power module performs switching of an inductive load such as motor, it is necessary to connect freewheel diodes in antiparallel. As shown in FIG. 10, switching device 31 and freewheel diode 32 which are two power semiconductor devices can each be joined to main terminal 5 to implement the aforementioned circuit.

In the power module configured in the above-described manner, the surface of main terminal 5 is joined by the bonding ribbon 7 to respective surfaces of power semiconductor devices 31, 32 facing the aforementioned surface of main terminal 5. Therefore, bonding ribbon 7 can flex to absorb strain generated due to a difference in linear expansion coefficient between main terminal 5 and power semiconductor devices 31, 32. Consequently, stress generated at the joint between main terminal 5 and power semiconductor devices 31, 32 is alleviated. Thus, peeling of main terminal 5 and power semiconductor devices 31, 32 from each other is suppressed, and the reliability of the joint between main terminal 5 and power semiconductor devices 31, 32 can be improved.

Moreover, main terminal 5 can be joined to power semiconductor devices 31, 32 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Tenth Embodiment

A tenth embodiment differs in that the power module in the tenth embodiment is of the transfer mold type, rather than the power module of the case type used in the first to ninth embodiments. Since the power module is of the transfer mold type, molding can be performed in one step, and thus the manufacture cost is reduced and the productivity can be improved.

Figure 11:
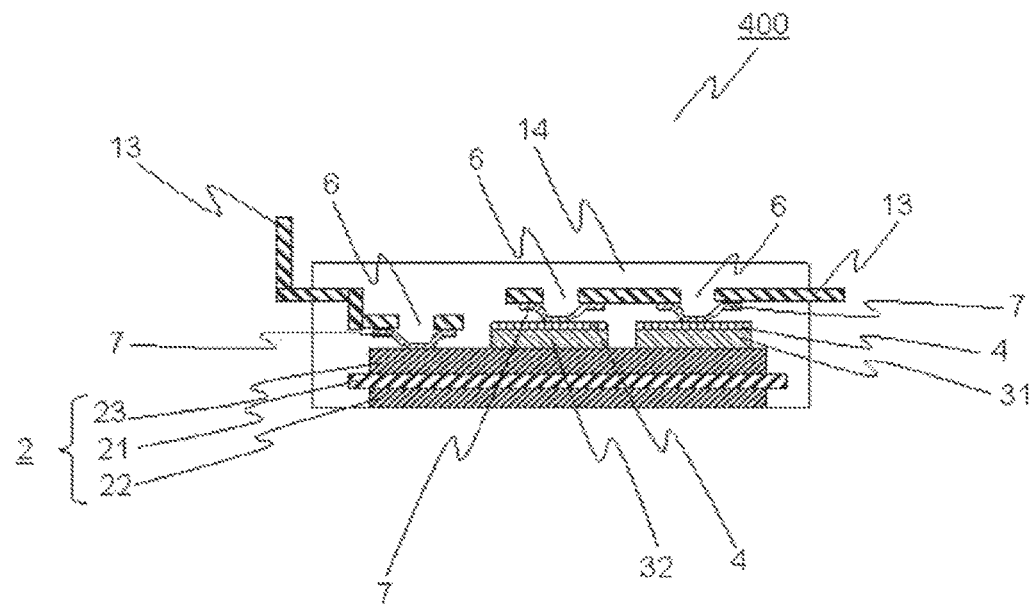
FIG. 11 is a schematic cross-sectional structure diagram of a power module in a tenth embodiment of the present invention.

FIG. 11 is a schematic cross-sectional structure diagram of a power module in the tenth embodiment of the present invention. In FIG. 11, power module 400 includes insulating substrate 2, power semiconductor devices 31, 32, surface electrode 4, opening 6, bonding ribbon 7, and a leadframe 13. Leadframe 13 replaces main terminals 5 and 10. Moreover, one-step molding with transfer mold resin 14 replaces the step of injecting sealant resin 11. While FIG. 11 shows a configuration without heat-dissipation metal base plate 1, the configuration may be provided with heat-dissipation metal base plate 1, like the configuration of the case type.

Insulating substrate 2 includes insulating layer 21 and metal plates 22, 23. Insulating substrate 2 has a structure in which metal plates 22, 23 of copper or the like are bonded to respective opposite sides of insulating layer 21 formed of a ceramic material such as aluminum oxide, aluminum nitride, or silicon nitride, or formed of epoxy resin or the like. On the front-side metal plate 23, an interconnect pattern (not shown) is formed. To this front-side metal plate 23, power semiconductor devices 31, 32 are joined with solder or the like (not shown).

In the power module configured in the above-described manner, the surface of leadframe 13 is joined by the bonding ribbon 7 to respective surfaces of power semiconductor devices 31, 32 facing the aforementioned surface of leadframe 13. Therefore, bonding ribbon 7 can flex to absorb strain generated due to a difference in linear expansion coefficient between leadframe 13 and power semiconductor devices 31, 32. Consequently, stress generated at the joint between leadframe 13 and power semiconductor devices 31, 32 is alleviated. Thus, peeling of leadframe 13 and power semiconductor devices 31, 32 from each other is suppressed, and the reliability of the joint between leadframe 13 and power semiconductor devices 31,32 can be improved.

Moreover, leadframe 13 can be joined to power semiconductor devices 31, 32 with the distance therebetween being as shortest as possible, and thus the electrical resistance of bonding ribbon 7 when the power module is energized can be reduced. Consequently, the amount of heat generated by bonding ribbon 7 when the power module is energized is reduced, and thus temperature increase of the power module is suppressed. Accordingly, the power module for higher current can be achieved.

Moreover, since transfer molding is used, molding can be performed in one step, and thus the manufacture cost is reduced and the productivity can be improved.

REFERENCE SIGNS LIST 1 heat-dissipation metal base plate; 2 insulating substrate; 3 power semiconductor device; 4 surface electrode; 5, 10 main terminal; 6, 12 opening; 7 bonding ribbon; 8 case; 9 ultrasonic welding tool; 11 sealant resin; 13 lead frame; 14 transfer mold resin; 21 insulating layer; 22, 23 metal plate; 31 switching device; 32 freewheel diode; 91 head; 100, 200, 300, 400 power module

The invention claimed is:

1. A power module comprising:
a base portion having one surface on which an electrode portion is formed;
a conductor portion disposed to face the base portion; and
an interconnect portion connected to the electrode portion and a surface of the conductor portion, the surface of the conductor portion facing the one surface of the electrode portion,
the conductor portion having an opening,
opposite ends of the interconnect portion being joined to the conductor portion across the opening, and
at a position corresponding to the opening, a part of the interconnect portion being joined to the electrode portion.

2. The power module according to claim 1, wherein a plurality of the openings are provided in the conductor portion.

3. The power module according to claim 2, wherein the interconnect portion is joined to the conductor portion across each of the plurality of the openings.

4. The power module according to claim 2, wherein the conductor portion has the opening across which the interconnect portion is not joined to the conductor portion.

5. The power module according to claim 1, wherein the base portion includes a first base portion and a second base portion.

6. The power module according to claim 5, wherein the power module includes a plurality of the second base portions.

7. The power module according to claim 5, wherein the first base portion is an insulating substrate.

8. The power module according to claim 5, wherein second base portion is a semiconductor device.

9. The power module according to claim 1, wherein
the power module further comprises a case housing the base portion, the conductive conductor portion, and the interconnect portion,
the base, the conductor portion, and the interconnect portion are sealed by a sealant filling an inside of the case, and
a material forming the sealant is a resin.

10. The power module according to claim 1, wherein the base portion, the conductor portion, and the interconnect portion are sealed by a sealant, and
a material forming the sealant is a transfer mold resin.

11. The power module according to claim 1, wherein the interconnect portion is a wire or a ribbon.

* * * * *